United States Patent
Franke

(10) Patent No.: US 10,473,733 B2
(45) Date of Patent: Nov. 12, 2019

(54) MAGNETIC FIELD COMPENSATION DEVICE

(71) Applicant: TDK-Micronas GmbH, Freiburg (DE)

(72) Inventor: Joerg Franke, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 262 days.

(21) Appl. No.: 15/646,641

(22) Filed: Jul. 11, 2017

(65) Prior Publication Data

US 2018/0321330 A1   Nov. 8, 2018

(30) Foreign Application Priority Data

May 8, 2017   (DE) .................. 10 2017 004 349

(51) Int. Cl.
| | | |
|---|---|---|
| *G01R 33/025* | (2006.01) | |
| *G01R 33/00* | (2006.01) | |
| *G01R 33/07* | (2006.01) | |
| *H01L 43/06* | (2006.01) | |

(52) U.S. Cl.
CPC ....... *G01R 33/025* (2013.01); *G01R 33/0017* (2013.01); *G01R 33/07* (2013.01); *H01L 43/065* (2013.01)

(58) Field of Classification Search
CPC .. G01R 33/025; G01R 33/0017; G01R 33/07; H01L 43/065
USPC ........................................................ 324/225
See application file for complete search history.

(56) References Cited

U.S. PATENT DOCUMENTS

| | | |
|---|---|---|
| 3,323,056 A | 5/1967 | Haley |
| 7,777,607 B2 | 8/2010 | Taylor et al. |
| 8,519,704 B2 | 8/2013 | Ide et al. |
| 8,754,642 B2 | 6/2014 | Ide et al. |
| 2005/0035761 A1 | 2/2005 | Park et al. |

(Continued)

FOREIGN PATENT DOCUMENTS

| | | |
|---|---|---|
| DE | 10 2014 211 311 A1 | 12/2015 |
| EP | 2 833 109 A1 | 2/2015 |

(Continued)

OTHER PUBLICATIONS

S. Kawahito et al., "A fluxgate magnetic sensor with micorsolenoids and electroplated permalloy cores", Sensors and Actuators A, 1994, pp. 128-134.

(Continued)

*Primary Examiner* — Melissa J Koval
*Assistant Examiner* — Rahul Maini
(74) *Attorney, Agent, or Firm* — Muncy, Geissler, Olds & Lowe, P.C.

(57) ABSTRACT

Magnetic field compensation device having a first bar-shaped flux concentrator and a second bar-shaped flux concentrator, wherein the first flux concentrator and the second flux concentrator are separated from one another in a y-direction, and the longitudinal axis of the first flux concentrator and the longitudinal axis of the second flux concentrator are arranged to be substantially parallel to one another. A control unit is in an operative electrical connection with the magnetic field sensor and the compensating coil, and the control unit is equipped to control the compensating current through the compensating coil using a measured signal from the magnetic field sensor in such a manner that, for an external magnetic field formed in the x-direction at the location of the magnetic field sensor, the magnetic field is substantially compensated.

21 Claims, 4 Drawing Sheets

(56) References Cited

U.S. PATENT DOCUMENTS

| | | |
|---|---|---|
| 2007/0222441 A1 | 9/2007 | Satoh |
| 2015/0042325 A1 | 2/2015 | Snoeij et al. |
| 2016/0349334 A1 | 12/2016 | Snoeij et al. |

FOREIGN PATENT DOCUMENTS

| | | |
|---|---|---|
| JP | H04155266 A | 5/1992 |
| JP | 2001264360 A | 9/2001 |
| JP | 2009180608 A | 8/2009 |
| JP | 2010071960 A | 4/2010 |
| JP | 2012021787 A | 2/2012 |
| JP | 2913117543 A | 6/2013 |

OTHER PUBLICATIONS

D. Heumann et al., "Closed Loop Current Sensors with Magnetic Probe", ECPE Seminar Sensors in Power Electronics, pp. 1-19, Mar. 3, 2007, Erlangen, Germany.

Heuman et al., "Closed Loop Current Sensors with Magnetic Probe," ECPE Seminar Sensors in Power Electronics, Erlangen, Germany, pp. 1-19 (Mar. 14-15, 2007).

MAGNETIC FIELD COMPENSATION DEVICE

This nonprovisional application claims priority under 35 U.S.C. § 119(a) to German Patent Application No. 10 2017 004 349.3, which was filed in Germany on May 8, 2017, and which is herein incorporated by reference.

BACKGROUND OF THE INVENTION

Field of the Invention

The invention concerns a magnetic field compensation device.

Description of the Background Art

Discrete and integrated magnetic field compensation devices are known from U.S. Pat. No. 8,754,642 B2, U.S. Pat. No. 8,519,704 B2, U.S. Pat. No. 3,323,056, and EP 2 833 109 A1.

Another magnetic field compensation device is known from D. Neuman et al., Closed Loop Current Sensors with Magnetic Probe, EPCE Seminar Sensors in Power Electronics, 15 Mar. 2007, Erlangen, Germany.

SUMMARY OF THE INVENTION

Against this background, the object of the invention is to specify a device that advances the state of the art.

According to the subject matter of the invention, a magnetic field compensation device is provided having a first bar-shaped flux concentrator with a longitudinal axis formed in an x-direction and with a first head end, and having a second bar-shaped flux concentrator with a longitudinal axis formed in the x-direction.

The first flux concentrator and the second flux concentrator are separated from one another in a y-direction, wherein the longitudinal axis of the first flux concentrator and the longitudinal axis of the second flux concentrator are arranged to be substantially parallel to one another.

The magnetic field compensation device also includes a magnetic field sensor and a compensating coil formed around the first flux concentrator and/or around the second flux concentrator, and a control unit, wherein the control unit is in an operative electrical connection with the magnetic field sensor and the compensating coil.

The control unit is equipped to control a compensating current through the compensating coil using a measured signal from the magnetic field sensor in such a manner that, for an external magnetic field formed in the x-direction at the location of the magnetic field sensor, the magnetic field is substantially compensated.

In the second flux concentrator, the magnetic field is formed in the direction of the x-axis.

The magnetic field sensor is located at the head end of the first flux concentrator.

The magnetic field sensor and the first flux concentrator and the second flux concentrator and the compensating coil and the control unit are each predominantly integrated into a semiconductor substrate.

By means of the compensating coil, a magnetic field that is opposite as compared to the second flux concentrator is induced in the first flux concentrator in order to compensate the external magnetic field. In other words, the compensating coil has an opposite winding direction at the two flux concentrators.

It should be noted that the control unit preferably is also equipped to determine the strength of the external magnetic field from the magnitude of the compensating current. The external magnetic field, which has its source outside the physical extent of the magnetic field compensation device, is also referred to hereinbelow as the primary magnetic field. Determination of the strength of the primary magnetic field preferably is carried out by means of reference values.

The two flux concentrators can be formed both in only a single conductive trace level or in different conductive trace levels. The compensating coil can also be implemented by means of conductive traces and vias so that the second or even both flux concentrators are enclosed. In particular, the control unit is implemented as an integrated circuit. Preferably, the individual components are all monolithically integrated together on one semiconductor component.

It should be noted that nearly or exactly a null magnetic field is created by means of the compensation of the magnetic field at the location of the magnetic field sensor. It is a matter of course that in the present case a determination of the strength of the magnetic field in the direction of the x-axis is carried out, although it is equally possible to determine the strength of the magnetic field in another spatial direction, in particular by rotating the arrangement in another spatial direction.

It should also be noted that the greater the external, which is to say primary, magnetic field is, the higher the magnetic field created by the compensating coil must become. The field lines of the magnetic field of the compensating coil are formed in the positive x-direction in the second flux concentrator. In other words, the external magnetic field and the magnetic field from the compensating coil are superimposed on one another in the same direction. In contrast, the external magnetic field and the magnetic field from the compensating coil are superimposed on one another in opposite directions and compensate one another.

It is a matter of course that the flux concentrators are made from a suitable material, in particular a ferromagnetic material. Preferably, magnetically soft materials with low hysteresis are used. In other words, at least a part of the flux concentrators functions as the core of the compensating coil.

It is also a matter of course that the flux concentrators collect all magnetic field components of the compensating coil, thereby improving efficiency, which is to say the ratio of compensating field in mT/compensating current in mA. At the same time, parts of the flux concentrators can weaken or improve the external field. This increases efficiency, which is to say the ratio of primary field in mT/compensating current in mA.

It is an advantage of the magnetic field compensation device that primary magnetic fields from current-carrying conductors can be determined in an accurate and reliable manner by means of the magnetic field compensation device from the magnitude of the compensating current. The conductors here are not located inside the magnetic field compensation device.

It is a further advantage that an operating current through the magnetic field sensor can be kept very small in each case. In this way, heating of the compensating coil and the magnetic sensor can be avoided and the accuracy of the determination increases.

It should also be noted that if the two flux concentrators are not magnetically coupled or are only weakly magnetically coupled, a part of the compensating coil is also arranged around the first flux concentrator. Here, the part of the compensating coil arranged around the first flux concentrator has an opposite winding direction as compared to the part of the compensating coil formed around the second flux concentrator.

When current is passed through the compensating coil, a magnetic field is induced in the first flux concentrator that is opposite in comparison to the second flux concentrator, or in other words, the direction of magnetic flux formed in one of the flux concentrators is in the positive x-direction, and in the other flux concentrator is in the negative x-direction, depending on the direction of the compensating current in the compensating coil. In the present case, however, the magnetic field compensation device is implemented by the compensating coil in such a manner that a direction of flux in the negative x-direction is induced in the first flux concentrator to compensate the magnetic field formed in the positive x-direction.

Preferably the second flux concentrator is predominantly or completely enclosed by the compensating coil.

In one improvement, the length of the second flux concentrator is greater than the length of the first flux concentrator in the x-direction. A damping or an amplification can be set through the ratio of the lengths of the two flux concentrators.

With the stated and described length ratio, the behavior is approximately equal between damping and amplification. In one embodiment, the first flux concentrator is shorter than the second flux concentrator.

In one improvement, the lengths of the two flux concentrators are approximately equal or exactly equal.

In another improvement, the second flux concentrator passes completely through the compensating coil.

In one embodiment, a third bar-shaped flux concentrator with a longitudinal axis formed in the y-direction is provided. Preferably, the third flux concentrator is magnetically coupled to the first flux concentrator and/or to the second flux concentrator.

In another embodiment, the compensating coil is formed around the third flux concentrator and/or around the first flux concentrator.

In one improvement, a fourth bar-shaped flux concentrator with a longitudinal axis formed in the x-direction is provided, wherein the fourth flux concentrator is spaced apart from the first flux concentrator opposite to the y-direction, and the longitudinal axis of the first flux concentrator and the longitudinal axis of the fourth flux concentrator are made to be substantially parallel to one another.

In another embodiment, a fifth bar-shaped flux concentrator with a longitudinal axis formed in the y-direction is provided. Preferably, the fifth flux concentrator is magnetically coupled to the first flux concentrator and/or to the fourth flux concentrator.

In one embodiment, the arrangement of the flux concentrators and the arrangement of the compensating coil are implemented with mirror-image symmetry about a y-z surface, so that two associated sub-arrangements are formed.

In another embodiment, the two arrangements are magnetically coupled to one another.

Preferably, the flux concentrators are each implemented as a single piece.

In one embodiment, the magnetic field sensor and the first flux concentrator and the second flux concentrator and the compensating coil and the control unit are all integrated into the same semiconductor substrate.

In another embodiment, the magnetic field sensor is implemented as an MR sensor formed in the semiconductor substrate or as a Hall sensor or as a fluxgate sensor.

In one improvement, the flux concentrators are connected to one another in a magnetically conductive manner or a gap is formed between the flux concentrators, wherein the gap between the flux concentrators is smaller than 4 times the diameter or smaller than the single diameter of the first flux concentrator.

Preferably all flux concentrators and the magnetic sensor are completely or almost completely enclosed by the compensating coil.

In another embodiment, the second flux concentrator is not enclosed by the compensating coil.

In one embodiment, the windings of the compensating coil have a cross-section that differs along the length. Preferably, the winding cross-section is smallest at a center of the compensating coil. In one improvement, the winding cross-section increases toward both ends of the compensating coil as compared to the winding cross-section in the center of the compensating coil, which is to say that the winding cross-section is largest at the two ends of the compensating coil.

Preferably, the winding cross-section of the compensating coil is smallest in the vicinity of the magnetic field sensor and is largest at the two ends of the first flux concentrator.

In one improvement, only the first flux concentrator and the magnetic field sensor are fully enclosed or nearly fully enclosed, but not the second flux concentrator or, if applicable, the other flux concentrators.

In one improvement, two different types of magnetic field sensor are implemented. In this case, both types of magnetic field sensor are arranged at the head end of the first flux concentrator or in a gap between two flux concentrators.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
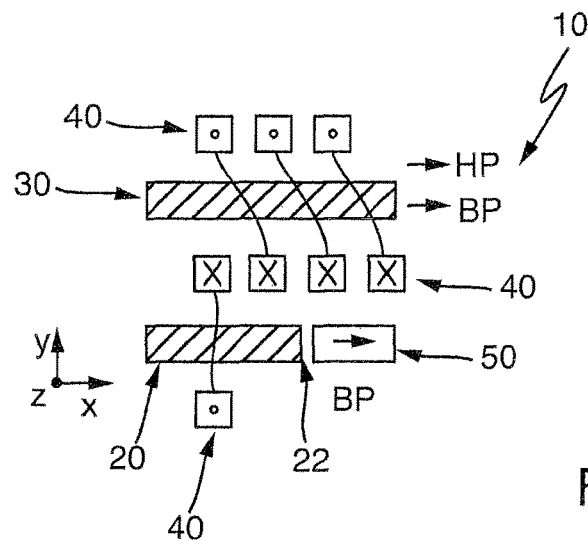
FIG. 1a shows a cross-section of a first embodiment.

The illustration in FIG. 1a shows a cross-section of a first embodiment of a magnetic field compensation device 10 in a state with no current applied. For reasons of clarity, a Cartesian coordinate system is included in the drawing.

The magnetic field compensation device 10 includes a first bar-shaped flux concentrator 20 with a head end 22, and a second bar-shaped flux concentrator 30 and a compensating coil 40 and a magnetic field sensor 50, and a control unit that is not shown. The magnetic field sensor 50 is located at the head end 22 of the first flux concentrator 20, hereinafter also referred to as the front end. For reasons of clarity, only the upper parts of the windings are illustrated for the compensating coil 40.

It should be noted that the magnetic field sensor 50 and the first flux concentrator 20 and the second flux concentrator 30 and the compensating coil 40 and the control unit, which is not shown, are each predominantly or completely integrated into a semiconductor substrate. The flux concentrators 20 and 30 are formed in the same conductive trace level or in different conductive trace levels. The compensating coil 40 can be implemented by means of conductive traces and vias. The control unit is implemented as an integrated circuit. In one embodiment, the individual components are all integrated together, preferably monolithically, on one semiconductor component.

The first flux concentrator 20 and the second flux concentrator 30 each have a longitudinal axis formed in the x-direction, wherein the first flux concentrator and the second flux concentrator 30 are separated from one another in the y-direction, and the longitudinal axis of the first flux concentrator 20 and the longitudinal axis of the second flux concentrator 30 are arranged to be substantially parallel to one another. In the x-direction, the length of the second flux concentrator is greater than the length of the first flux concentrator.

The compensating coil 40 almost completely encloses the second flux concentrator 30. Preferably, the compensating coil 40 also at least partially encloses the first flux concentrator 20, and in an embodiment that is not shown, the magnetic field sensor 50 as well.

The part of the compensating coil 40 arranged around the first flux concentrator 20 and the magnetic field sensor has an opposite winding direction as compared to the part of the compensating coil 40 formed around the second flux concentrator 30.

As a result, a compensating current through the compensating coil has the effect that a magnetic field is induced in the first flux concentrator 20 that is opposite in comparison to that in the second flux concentrator 30, or in other words the direction of magnetic flux formed in one of the two flux concentrators 20, 30 is in the positive x-direction, and in the other of the two flux concentrators 20, 30 is in the negative x-direction, depending on the direction of the compensating current in the compensating coil.

The magnetic field compensation device 10 is located in an external primary magnetic field HP formed in the positive x-direction. Accordingly, a primary magnetic flux BP formed in the positive x-direction is induced in each case in the first flux concentrator 20 and the second flux concentrator 30.

Figure 1B:
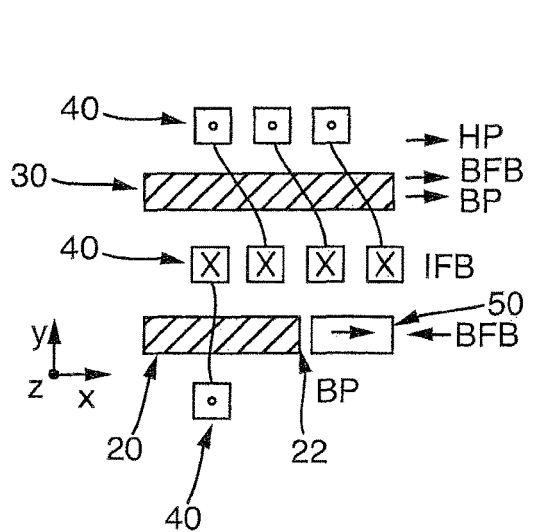
FIG. 1b shows a cross-section of the first embodiment with applied compensating field.

FIG. 1b shows a cross-section of the first embodiment according to the invention (depicted in FIG. 1a) with a compensating field applied, which is to say in the state with current applied.

The control unit is in operative electrical connection with the magnetic field sensor 50 and the compensating coil 40 and is equipped to determine the strength of the primary magnetic field BP using a measured signal from the magnetic field sensor 50 and to apply current to the compensating coil 40 by means of a compensating current IFB so that the external primary magnetic field BP formed in the x-direction by means of a secondary magnetic field BFB that is induced in the first flux concentrator 20 at the location of the magnetic field sensor 50 by the compensating current IFB, and to regulate the magnitude of the compensating current IFB such that a so-called null field results in the x-direction at the location of the magnetic field sensor 50.

In other words, in the present case a secondary magnetic flux BFB is induced in the negative x-direction in the first flux concentrator 20 and in the positive x-direction in the second flux concentrator 30. The primary magnetic field BP and the secondary magnetic field BFB point in the same direction in the second flux concentrator 30.

Moreover, the control unit is equipped to determine the strength of the primary magnetic field BP from the magnitude of the compensating current IFB.

Figure 2:
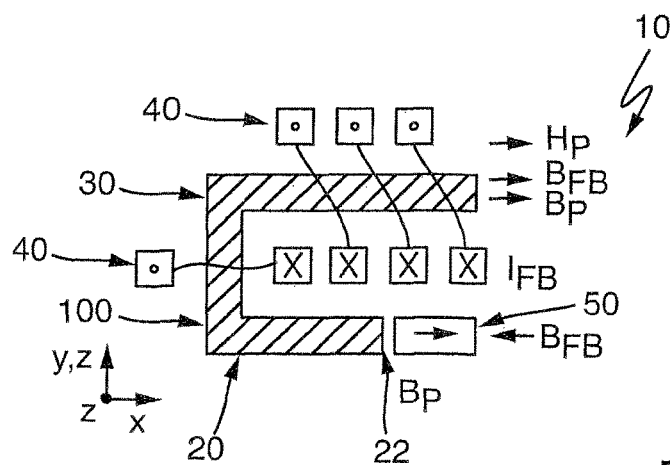
FIG. 2 shows a cross-section of a second embodiment with applied compensating field.

In FIG. 2, a cross-section of a second embodiment is shown with a compensating field applied. Only the differences from the preceding embodiments are explained below.

A third bar-shaped flux concentrator 100 with a longitudinal axis formed in the y-direction is provided between the first flux concentrator 20 and the second flux concentrator 30. The third flux concentrator 100 is connected in a magnetically conductive manner, i.e. integrally joined, to the first flux concentrator 20 and the second flux concentrator 30 in order to improve the efficiency of the compensating coil.

The compensating coil 40 is formed around the second flux concentrator 30 and partially around the third flux concentrator 100. The three flux concentrators 20, 30, and 100 are arranged in a U-shape.

Figure 3:
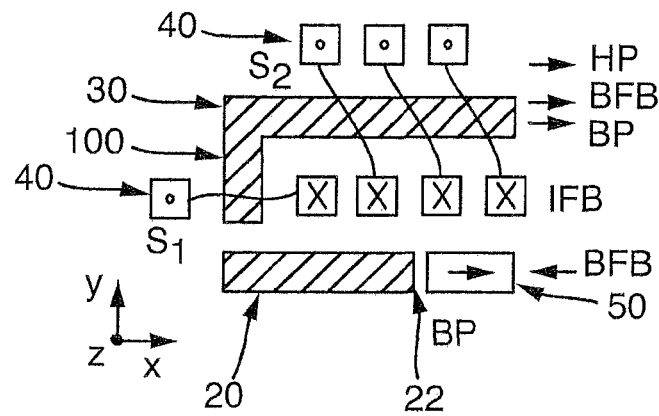
FIG. 3 shows a cross-section of a third embodiment with applied compensating field.

In FIG. 3, a cross-section of a third embodiment is shown with a compensating field applied. Only the differences from the embodiment in FIG. 2 are explained below.

The third flux concentrator 100 is magnetically coupled to the second flux concentrator 30, while a gap smaller than the diameter of the first flux concentrator is formed between the third flux concentrator 100 and the first flux concentrator. Because the gap between the first flux concentrator and the third flux concentrator is very small, the two flux concentrators remain magnetically coupled.

Figure 4:
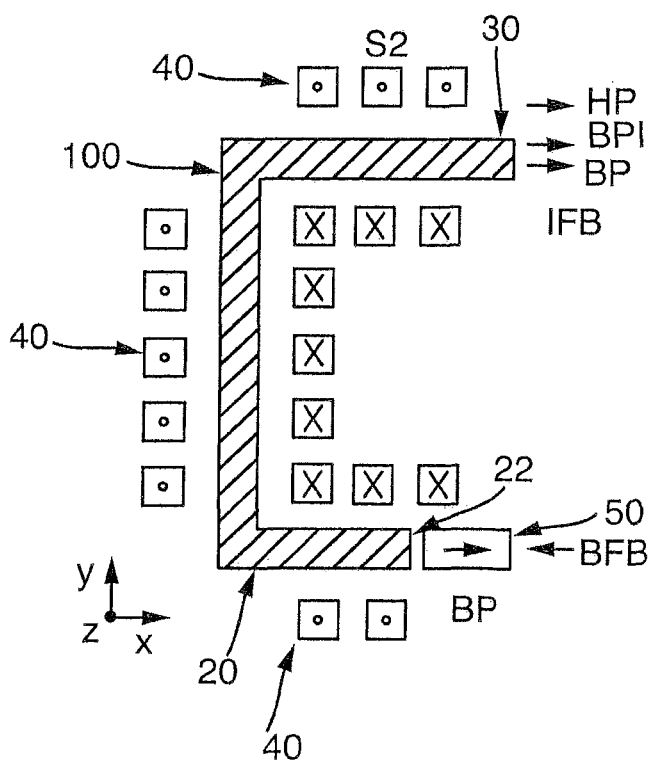
FIG. 4 shows a cross-section of a fourth embodiment with applied compensating field.

In FIG. 4, a cross-section of a fourth embodiment is shown with a compensating field applied. Only the differences from the embodiment in FIG. 2 are explained below.

The compensating coil 40 is formed around all three flux concentrators 20, 30, and 100, and preferably around the magnetic field sensor as well.

Figure 5:
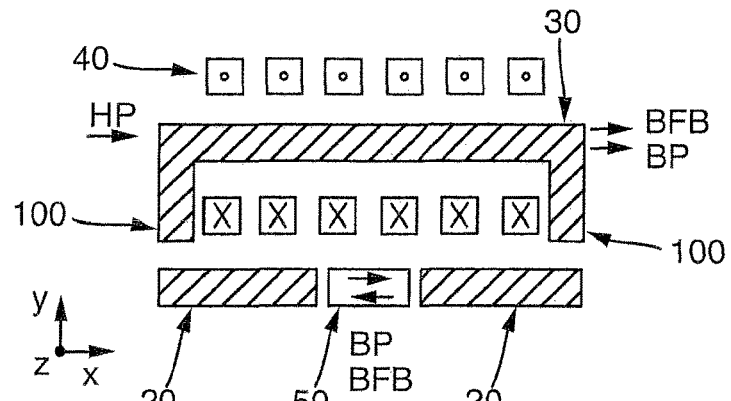
FIG. 5 shows a cross-section of a fifth embodiment with applied compensating field.

In FIG. 5, a cross-section of a fifth embodiment is shown with a compensating field applied. Only the differences from the embodiment in FIG. 3 are explained below.

The arrangement from FIG. 3 is extended with mirror-image symmetry about a surface in the y-z plane, wherein the mirror surface is arranged in the x-direction such that a doubling of the structure shown in FIG. 3 is produced. The magnetic field sensor 50 is located between the two head ends of the two parts of the first flux concentrators 20. In other words, the mirror surface passes through the magnetic field sensor 50 at its center.

The compensating coil 40 fully encloses only the now elongated second flux concentrator 30. A small gap to the two parts of the third flux concentrators 100 is formed in each case between the two parts of the first flux concentrators 20.

Figure 6:
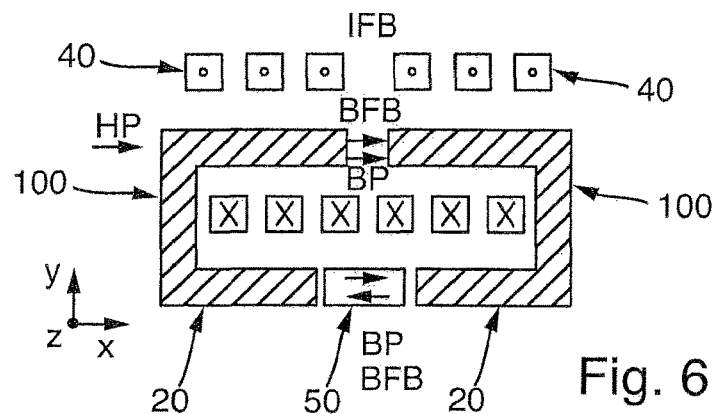
FIG. 6 shows a cross-section of a sixth embodiment with applied compensating field.

In FIG. 6, a cross-section of a sixth embodiment is shown with a compensating field applied. Only the differences from the embodiment in FIG. 5 are explained below.

The arrangement from FIG. 2 is extended with mirror-image symmetry about a surface in the y-z plane, wherein the mirror surface is arranged in the x-direction such that a doubling of the structure shown in FIG. 2 is produced. The magnetic field sensor 50 is located between the two head ends of the two parts of the first flux concentrators 20.

The compensating coil 40 fully encloses only the now elongated second flux concentrator 30. The second flux concentrator 30 has two parts with a small gap formed at the location of the mirror surface. However, the two parts of the second flux concentrator are magnetically coupled to one another.

Figure 7:
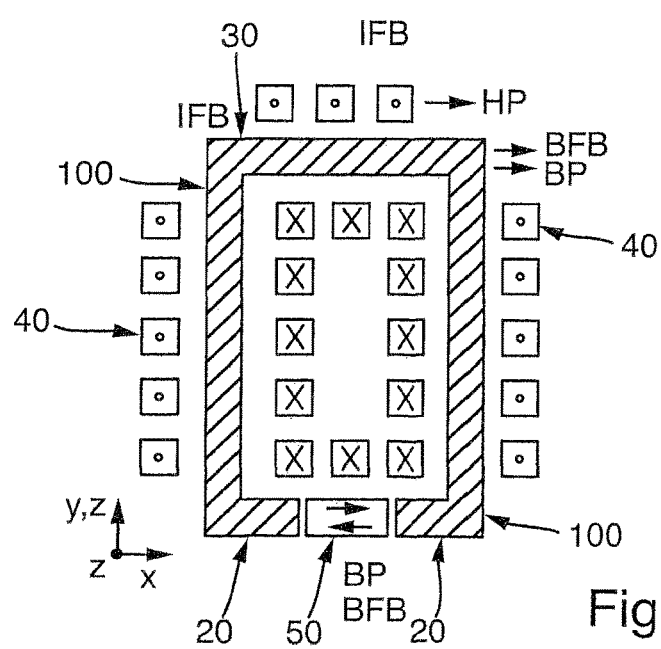
FIG. 7 shows a cross-section of a seventh embodiment with applied compensating field.

In FIG. 7, a cross-section of a seventh embodiment is shown with a compensating field applied. Only the differences from the embodiment in FIG. 6 are explained below.

The two parts of the second flux concentrator 30 are now connected to one another. The compensating coil 40 almost completely encloses the elongated second flux concentrator 30 and the two parts of the third flux concentrator 100.

Figure 8:
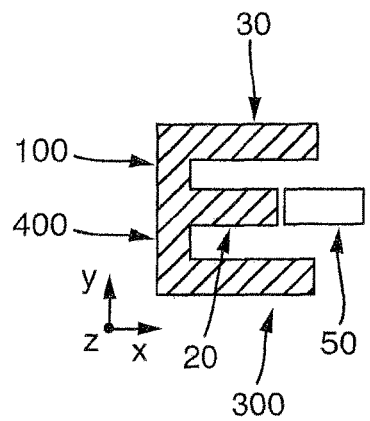
FIG. 8 shows a cross-section of an eighth embodiment.

FIG. 8 shows a cross-section of an eighth embodiment. Only the differences from the preceding embodiments are explained below. For reasons of clarity, only the flux concentrators are shown.

The arrangement from FIG. 2 is extended with mirror-image symmetry about a surface in the x-z plane, wherein the mirror surface is arranged in the y-direction such that a doubling of the structure shown in FIG. 2 is produced, and wherein the mirror surface passes through the magnetic field sensor 50 at its center.

In other words, a fourth bar-shaped flux concentrator 300 with a longitudinal axis formed in the x-direction is provided. The fourth flux concentrator 300 is spaced apart from the first flux concentrator 20 opposite to the y-direction, and the longitudinal axis of the first flux concentrator 20 and the longitudinal axis of the fourth flux concentrator 300 are made to be substantially parallel to one another. A fifth bar-shaped flux concentrator 400 with a longitudinal axis formed in the y-direction is provided. The fifth flux concentrator 400 is connected in a magnetically conductive manner, i.e. is directly connected, to the first flux concentrator 20 and to the fourth flux concentrator 300.

Figure 9:
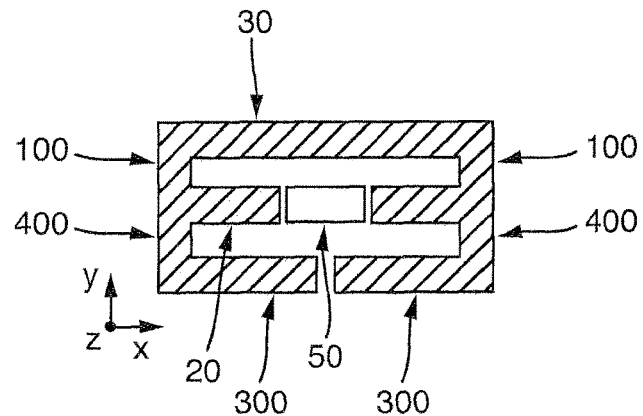
FIG. 9 shows a cross-section of a ninth embodiment.

FIG. 9 shows a cross-section of a ninth embodiment. Only the differences from the embodiment shown in connection with the illustration in FIG. 8 are explained below.

The arrangement from FIG. 8 is extended with mirror-image symmetry about a surface in the y-z plane, wherein the mirror surface is arranged in the x-direction such that a doubling of the structure shown in FIG. 8 is produced, and wherein the mirror surface passes through the magnetic field sensor 50 at its center. A small gap is formed between the two parts of the fourth flux concentrator 300. However, the two parts of the fourth flux concentrator 300 are magnetically coupled.

Figure 10:
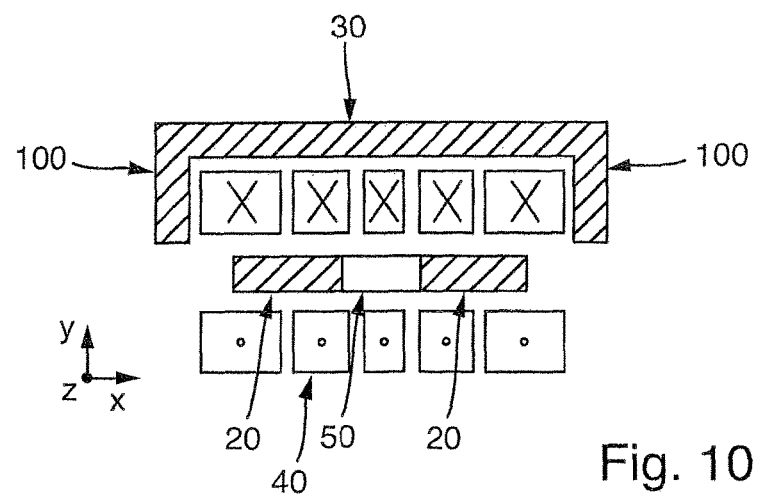
FIG. 10 shows a cross-section of a tenth embodiment.

FIG. 10 shows a cross-section of a tenth embodiment. Only the differences from the embodiment shown in connection with the illustration in FIG. 5 are explained below. For reasons of clarity, a representation with no current applied has been chosen.

The two parts of the first flux concentrator 20 are shorter than the second flux concentrator 30. In the present case, the compensating coil 40 encloses only the first flux concentrator 20 and the magnetic field sensor 50, and has windings with different cross-sections. In this case, the cross-section is smallest in the vicinity of the magnetic field sensor 50 and is largest at the two ends of the two parts of the first flux concentrator 20.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A magnetic field compensation device comprising:
a first bar-shaped flux concentrator with a longitudinal axis formed in an x-direction and with a first head end,
a second bar-shaped flux concentrator with a longitudinal axis formed in the x-direction and with a second head end, wherein the first flux concentrator and the second flux concentrator are separated from one another in a y-direction, and the longitudinal axis of the first flux concentrator and the longitudinal axis of the second flux concentrator are arranged to be substantially parallel to one another,
a magnetic field sensor,
a compensating coil formed around the first flux concentrator and/or around the second flux concentrator, and
a control unit, wherein the control unit is in an operative electrical connection with the magnetic field sensor and the compensating coil, and the control unit is equipped to control a compensating current through the compensating coil using a measured signal from the magnetic field sensor in such a manner that, for an external magnetic field formed in the x-direction at the location of the magnetic field sensor, the magnetic field is substantially compensated,
wherein, in the second flux concentrator, the magnetic field is formed in the direction of the x-axis, and the magnetic field sensor is located at the first head end of the first flux concentrator and not at the second head end of the second flux concentrator, and the magnetic field sensor and the first flux concentrator and the second flux concentrator and the compensating coil and the control unit are each predominantly integrated into a semiconductor substrate.

2. The magnetic field compensation device according to claim 1, wherein the length of the second flux concentrator is greater than the length of the first flux concentrator in the x-direction, or the length of the second flux concentrator is less than the length of the first flux concentrator in the x-direction, or in that the lengths of the two flux concentrators are equal.

3. The magnetic field compensation device according to claim 1, wherein the first flux concentrator and/or the second flux concentrator passes completely through the compensating coil.

4. The magnetic field compensation device according to claim 1, wherein a third bar-shaped flux concentrator with a longitudinal axis formed in the y-direction is provided between the first flux concentrator and the second flux concentrator.

5. The magnetic field compensation device according to claim 4, wherein the third flux concentrator is magnetically coupled to the first flux concentrator and/or to the second flux concentrator.

6. The magnetic field compensation device according to claim 1, wherein the compensating coil is formed around the third flux concentrator and/or around the first flux concentrator, or the compensating coil is formed around all the flux concentrators.

7. The magnetic field compensation device according to claim 1, wherein the compensating coil is formed fully or at least partially around the magnetic field sensor.

8. The magnetic field compensation device according to claim 1, wherein a fourth bar-shaped flux concentrator with a longitudinal axis formed in the x-direction is provided, and the fourth flux concentrator is spaced apart from the first flux concentrator opposite to the y-direction, and the longitudinal axis of the first flux concentrator and the longitudinal axis of the fourth flux concentrator are made to be substantially parallel to one another.

9. The magnetic field compensation device according to claim 4, wherein a fifth bar-shaped flux concentrator with a longitudinal axis formed in the y-direction is provided.

10. The magnetic field compensation device according to claim 9, wherein the fifth flux concentrator is magnetically coupled to the first flux concentrator and/or to the fourth flux concentrator.

11. The magnetic field compensation device according to claim 1, wherein the arrangement of the flux concentrators and the arrangement of the compensating coil are implemented with mirror-image symmetry about a y-z surface, so that the arrangement is composed of two sections.

12. The magnetic field compensation device according to claim 10, wherein the two sections are magnetically coupled to one another.

13. The magnetic field compensation device according to claim 1, characterized in that the flux concentrators are each implemented as a single piece.

14. The magnetic field compensation device according to claim 1, wherein the magnetic field sensor and the first flux concentrator and the second flux concentrator and the compensating coil and the control unit are all integrated into the same semiconductor substrate.

15. The magnetic field compensation device according to claim 1, wherein the flux concentrators are connected to one another in a magnetically conductive manner or a gap is formed between the flux concentrators, wherein the gap between the flux concentrators is smaller than 4 times the diameter or smaller than the diameter of the first flux concentrator.

16. The magnetic field compensation device according to claim 1, wherein the direction of the magnetic field created in the first flux concentrator by the compensating coil is opposite to the direction of the magnetic field induced in the second flux concentrator by the compensating coil.

17. The magnetic field compensation device according to claim 1, wherein the cross-section of the windings changes along the length of the compensating coil.

18. The magnetic field compensation device according to claim 1, wherein the compensating coil is formed around only the first flux concentrator and/or around the magnetic field sensor.

19. The magnetic field compensation device according to claim 1, wherein the magnetic field sensor is implemented as a Hall sensor or as a GMR sensor or as a TMR sensor, or in that two different types of magnetic field sensor are implemented.

20. The magnetic field compensation device according to claim 1, wherein the magnetic field sensor is implemented as a Hall sensor formed in the semiconductor substrate.

21. The magnetic field compensation device according to claim 1, wherein in the X-direction a length of the second flux concentrator is larger than a length of the first flux concentrator or in the X-direction the length of the second flux concentrator is smaller than the length of the first flux concentrator.

* * * * *